United States Patent [19]

Brunk

[11] Patent Number: 5,206,946
[45] Date of Patent: Apr. 27, 1993

[54] APPARATUS USING CONVERTERS, MULTIPLEXER AND TWO LATCHES TO CONVERT SCSI DATA INTO SERIAL DATA AND VICE VERSA

[75] Inventor: John L. Brunk, Brighton, Mich.

[73] Assignee: Sand Technology Systems Development, Inc., Quebec, Canada

[21] Appl. No.: 427,723

[22] Filed: Oct. 27, 1989

[51] Int. Cl.$^5$ .............................................. G06F 5/00
[52] U.S. Cl. .......................... 395/500; 364/238.5; 364/260.1; 364/260.4; 364/DIG. 2; 395/800
[58] Field of Search ... 364/900 MS File, 200 MS File; 371/47.1, 55; 375/55; 395/200, 500, 800

[56] References Cited
U.S. PATENT DOCUMENTS

| | | | |
|---|---|---|---|
| 4,276,656 | 6/1981 | Petryk, Jr. | 455/608 |
| 4,809,217 | 2/1989 | Floro et al. | 364/900 |
| 4,866,609 | 9/1989 | Calta et al. | 364/200 |
| 4,908,823 | 3/1990 | Haagens et al. | 370/85.1 |
| 4,939,735 | 7/1990 | Fredericks et al. | 371/47.1 |
| 5,023,829 | 6/1991 | Shibata | 364/900 |

Primary Examiner—Thomas C. Lee
Attorney, Agent, or Firm—Cushman, Darby & Cushman

[57] ABSTRACT

A network extender for a computer network including multiple computers interconnected with a shared, common memory. A computer system interface interconnects the multiple computers and controls data flow between the multiple computers and a memory controller connected to the memory. First and second identical interfaces are respectively connected in data communication with the computer system interface and the memory controller. Each interface includes a circuit for converting parallel data to serial data format and a circuit for converting serial data to parallel data format. The parallel to serial converting circuit and the serial to parallel converting circuit of the first interface are respectively connected to the corresponding serial to parallel and the parallel to serial converting circuits of the second interface by serial data communication conductors.

7 Claims, 6 Drawing Sheets

FIG. 3A

APPARATUS USING CONVERTERS, MULTIPLEXER AND TWO LATCHES TO CONVERT SCSI DATA INTO SERIAL DATA AND VICE VERSA

BACKGROUND OF THE INVENTION

1. Field of the Invention

The present invention relates, in general, to computer networks and, more specifically, to interfaces for interconnecting multiple computers in a network configuration for access to common, stored programs and/or data stored in a memory.

Computer networks, such as a conventional prior art computer network shown in FIG. 1, typically include a number of computers, such as small or personal computers, which are interconnected via common data, address and control signal busses with a common memory comprising hard disks or tapes and shared peripheral I/O devices, such as CRTs and printers. Typically, a memory controller controls the flow of data and control signals between the busses and the memory and peripheral I/O devices.

An interface, such as a small computer system interface (SCSI), connects each peripheral computer to the shared busses to allow access of any individual computer to the common memory and I/O devices. The computer system interface controls the flow of data and control signals between the devices connected to the network.

However, in such computer networks, data communication between the peripheral computers, the computer system interface, the common memory and the peripheral I/O devices is in parallel bytes. Such parallel data transfer places a severe distance restriction on the network which limits the length of the communication busses between the computer system interface and the memory controller. Such distances have been limited to less than 100 feet. Thus, the interface must be physically located in relatively close proximity to the memory, such as within 90 feet. This limits the use of computer networks to those applications where the computer system interface and the memory can be located in such close proximity.

Thus, it would be desirable to provide a computer network expander for a computer network which enables peripheral computers and computer system interfaces to be physically located at considerable distances from a common, shared memory and shared, peripheral I/O devices. It would also be desirable to provide a computer network extender which is simple and inexpensive to add to a computer network. Finally, it would be desirable to provide a computer network extender which does not require modification of the existing peripheral computers, computer system interface, memory or I/O devices.

SUMMARY OF THE INVENTION

The present invention is an extender for a computer network including multiple computers, a computer system interface interconnecting the multiple computers and controlling the flow of data to and from the computers, and a memory controller for controlling the flow of data to and from a common, shared memory. The computer network extender comprises a first interface connected in data communication with the computer system interface. A second, identical interface is connected in data communication with the memory controller or a second central processing unit.

Each of the first and second interfaces is identically constructed and includes a parallel to serial means for converting parallel data byte information to serial data format and serial to parallel means for converting serial data to parallel data byte format. The first and second interfaces also include means, responsive to the parallel to serial converting means, for transmitting serial data from the interface and means, associated with the serial to parallel converting means, for receiving serial data.

Serial data communication means connects the transmitting means of the first interface with the receiving means of the second interface and, also, connects the receiving means of the first interface with the transmitting means of the second interface for bi-directional serial data communication between the first and second interfaces. The serial communicating means may comprise any pair of data communication cables or conductors, such as a pair of twisted cables or fiber optic conductors.

The computer network extender of the present invention greatly extends the physical distance possible between a computer system interface and a memory controller or other processing unit in a computer network from the maximum of approximately 90 feet previously possible in computer networks utilizing parallel data transfer to a distance of up to 1.8 miles at 200 megabit data transfer rates. The computer network extender includes an interface which is attachable to the computer system interface. The interface is simple and inexpensive in cost and requires no modification of the computer system interface or the attached peripheral computers. An identical interface is attached to the memory and/or memory controller or other processing unit for receiving the signals from the first interface.

BRIEF DESCRIPTION OF THE DRAWINGS

The various features, advantages and other uses of the present invention will become more apparent by referring to the following detailed description and drawing in which:

FIGS. 3A and 3B are schematic diagrams of a portion of the computer network extender of the present invention showing the cable connectors and line drivers thereof;

DESCRIPTION OF THE PREFERRED EMBODIMENT

Figure 1:
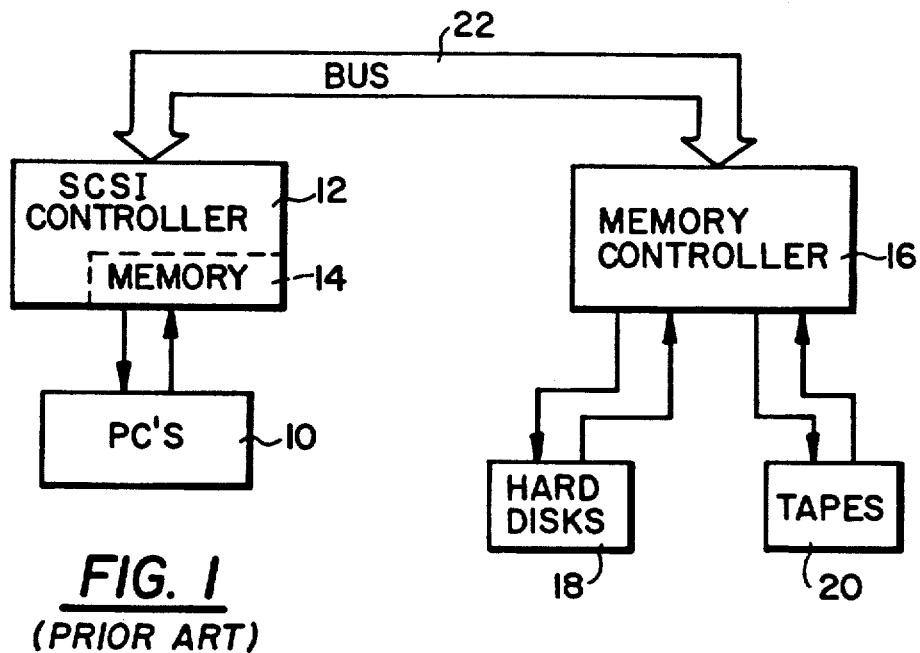
FIG. 1 is a block diagram of a conventional, prior art computer network.

Throughout the following description and drawing, an identical reference number is used to refer to the same component shown in multiple figures of the drawing.

The present invention, as shown in the drawing, is a computer network extender for a computer network which increases the physical distance separating the computer system interface coupled to the peripheral computers and the main memory, memory controller or other processing unit. The computer network extender provides such increased distance by an interface which converts the parallel data from the computer system interface to serial format for high speed data transfer to the memory controller. An identical interface connected to the memory controller reconverts the serial data to parallel data format for use by the memory controller and common memory. This enables the distance between the small computer system interface and the memory controller or between any two data communication processing elements in a computer network to be up to 1.8 miles apart.

Figure 2:
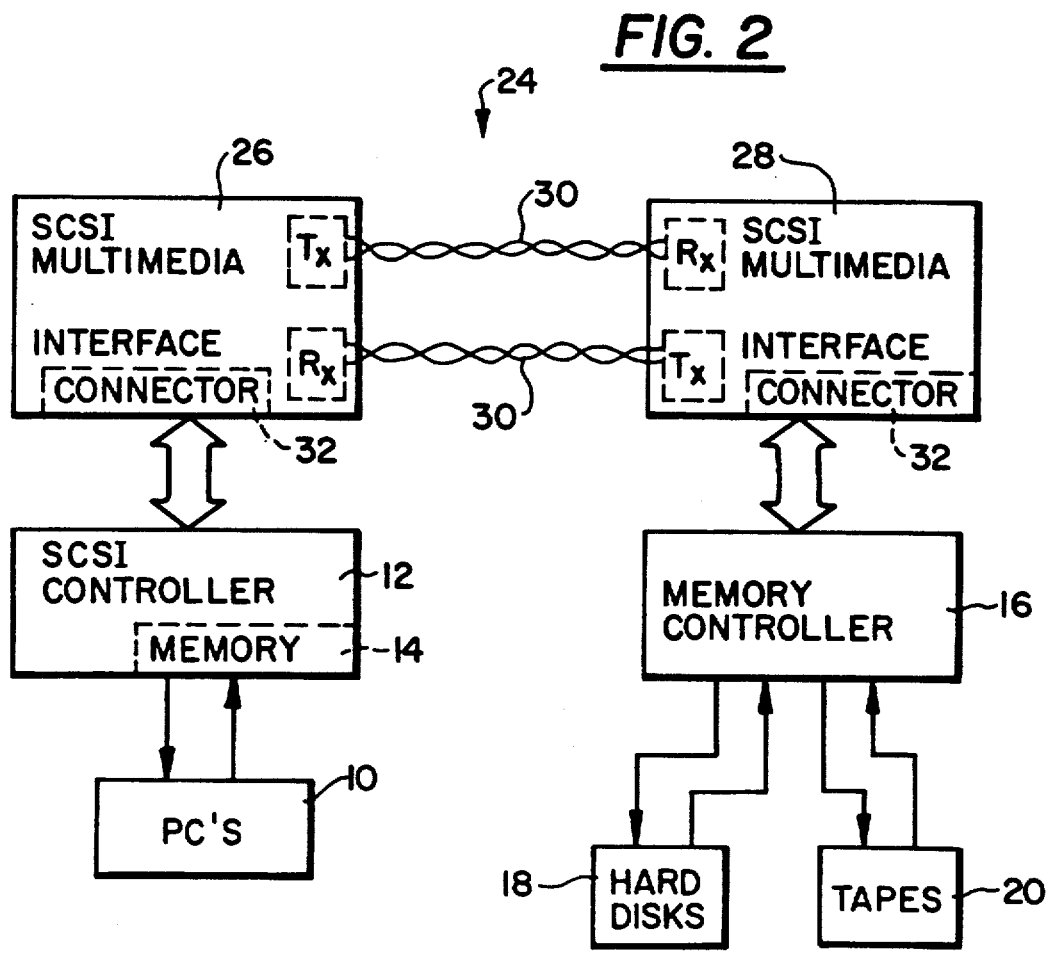
FIG. 2 is a block diagram of a computer network utilizing the computer network extender of the present invention.

FIG. 2 depicts a block diagram of the computer network extender of the present invention employed in a conventional computer network. The elements of the computer network are illustrated in FIG. 1 and an identical reference number is used for the same elements in both figures.

The computer network may have any form and may contain any number of interconnected elements. Preferably, as shown in FIGS. 1 and 2, a typical computer network comprises a plurality of data processing devices 10, such as independent central processing units. Preferably, the central processing units 10 comprise small or personal computers. Such data processing units 10 are interconnected with a small computer system interface controller (SCSI) 12. The SCSI controller 12 includes an internal memory 14 which stores a control program executed by the SCSI controller 12. The SCSI controller 12 controls the flow of data to and from the independent data processing units 10 and provides hierarchy, timing and signal access functions for the data processors 10.

A memory controller 16 also forms a part of a conventional computer network and controls the flow of data between the SCSI controller 12 and various memory devices, such as hard disks 18 and magnetic tape drives 20.

As shown in FIG. 1, the typical prior art computer network utilizes a common bus or busses 22 to provide data, address and control signal communication between the SCSI controller 12 and the memory controller 16. As is conventional, all data transfer between the individual data processing units 10 and the SCSI controller 12, the SCSI controller 12 and the memory controller 16 over the bus 22, and between the memory controller 16 and the hard disks 18 and the magnetic tape drives 20 is in parallel in which data bytes of 8, 16, etc. bit lengths are transferred simultaneously between the various portions of the network.

As shown in FIG. 2, the computer network extender 24 of the present invention includes first and second interfaces 26 and 28, respectively. The first interface 26 is, disposed in data communication with the SCSI controller 12 of a first central processing unit; while the second interface 28 is disposed in parallel data communication with a second central processing unit, such as the memory controller 16. Serial data communication means in the form of pairs of two-wire conductors 30 interconnect the first and second interfaces 26 and 28 and provide high speed serial data transfer between the first and second interfaces 26 and 28 as described hereafter.

Both of the first and second interfaces 26 and 28 provide parallel to serial data conversion to convert the parallel data from the respective SCSI controller 12 or memory controller 16 to a serial format for data transfer to the opposite interface over the serial data communication means 30. Such serial data is transferred in the interface to parallel format for data transfer with the respective central processing unit.

As each of the first and second interfaces 26 and 28 is identically constructed, the following discussion with reference to FIGS. 3A, 3B, 4A, 4B, 5A and 5B will be for the first interface 26; but is intended to apply to the construction of both of the first and second interfaces 26 and 28.

Figure 3A:
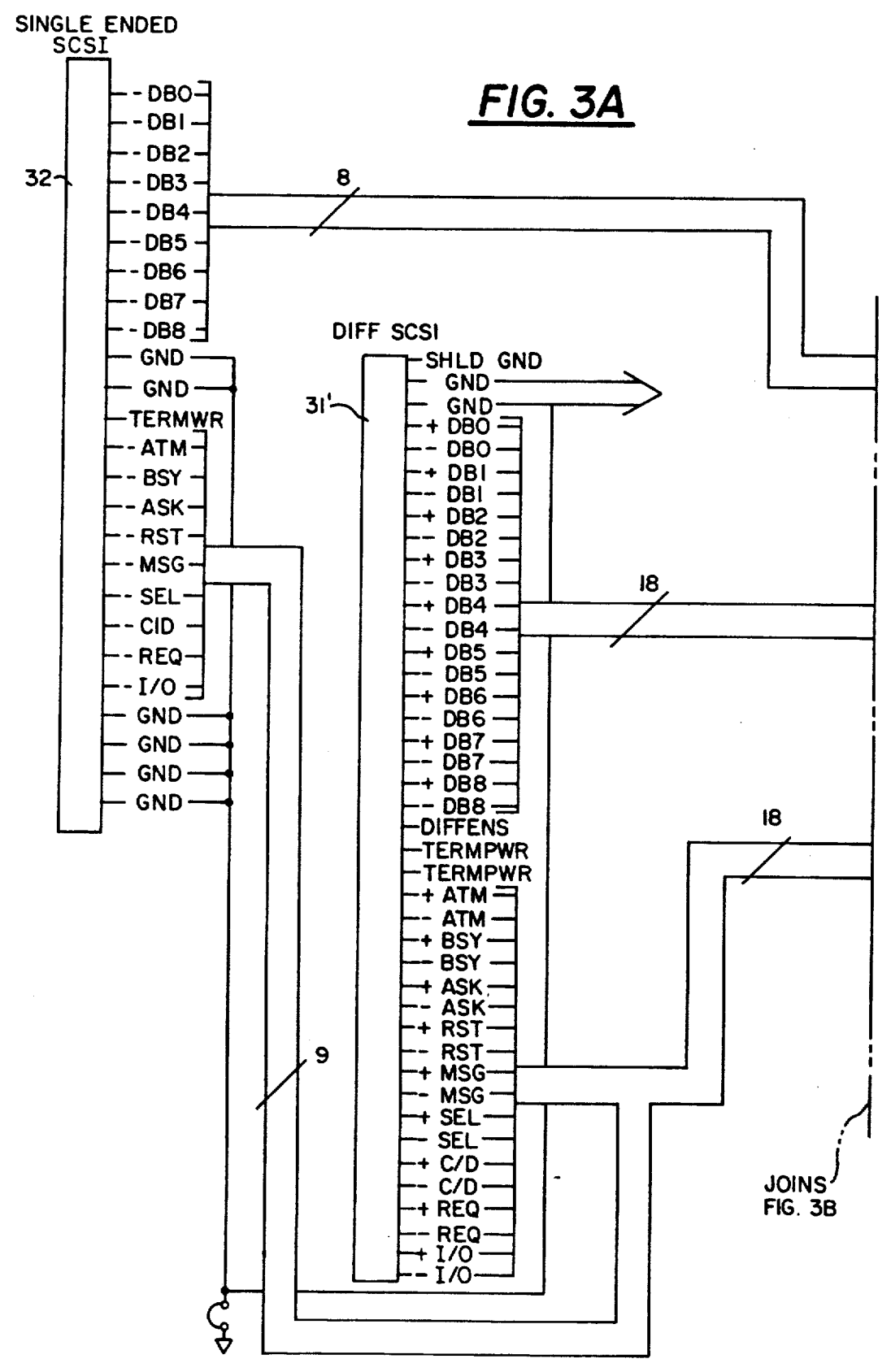
Figure 3B:
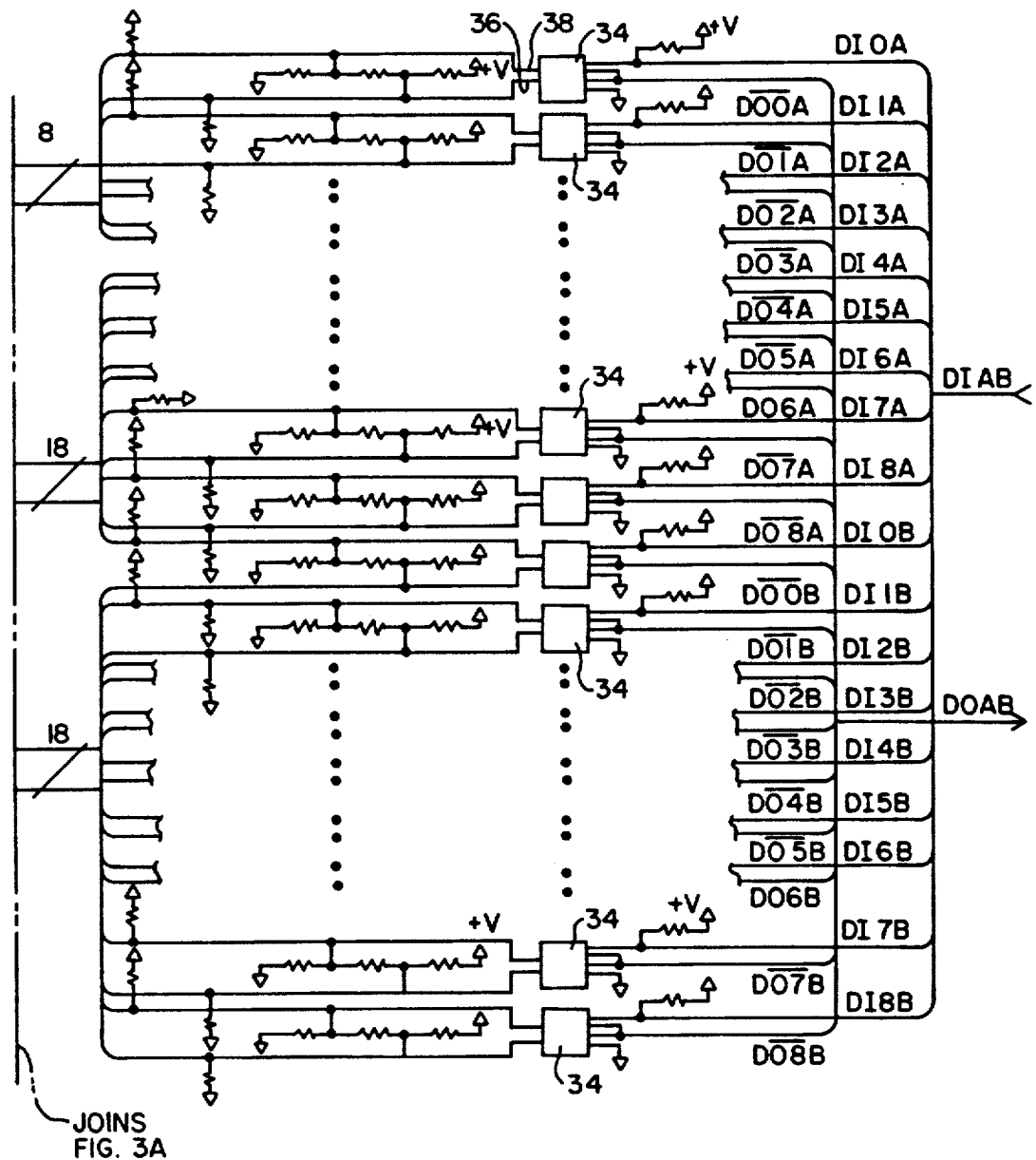

The interface 26 includes a connector 32, shown in FIG. 3A. The connector 32 provides single ended parallel data connection to the SCSI controller 12. The connector 32 provides various data connections labeled $-DB0$ - $-DB8$, as well as other negative signals labeled ATM, BSY, ASK, RST, MSG, SEL, C/D, REQ, I/O and ground required for conventional SCSI data transfer. A differential connector 32' is also provided in the interface 26 for differential data transfer with the SCSI controller 12 or the memory controller 16. This connector 32' provides the plus and minus data signals described above for each of the various data, address and control signals output or input to and from the SCSI controller 12 or the memory controller 16. The data terminals or pins in the connectors 32 and 32' are connected to individual transceivers 34, FIG. 3B. A separate transceiver 34 which provides bi-directional data signal receiving and transmitting functions is provided for each data signal terminal or pin on each of the connectors 32 and 32'. As the transceivers 34 are connected to the connectors 32 or 32' in the same manner, only a description of one transceiver 34 connection will be provided. It will be understood that similar circuit connections are provided for all of the signals on each of the connectors 32 and 32'.

The transceivers 34 may be any conventional bi-directional device, such as Model No. SN75176B. This is a conventional differential bus transceiver which may be employed in the present invention. A resistive biasing network is connected to and between the plus and minus inputs and plus and minus outputs of each transceiver 34 as shown in FIG. 3B.

The $-DB0$ signal from the connector 32 is connected to the negative input 36 of the transceiver 34 shown in FIG. 3B along the $-DB0$ data signal from the connector 32'. Thus, the $-DB0$ signal is provided regardless of which connector 32 or 32' is employed in the interface 26 for connection to the SCSI controller 12. The $+DB0$ signal from the connector 32' is connected to the positive input 38 of the transceiver 34. Similar data connections are provided for all of the data signals on the connector 32 and the data signals on the connector 32' to each of the transceivers 34 thereby providing separate transceivers for each set of data signals and separate outputs therefrom. Each of the transceivers 34 outputs a pair of signals, such as signals labeled DI0A and DI0A for the first set of signals. Such signals are provided for each of the data signals on the connectors 32 and 32' and are grouped in two separate data busses labeled DIAB and DOAB. Each of the signals on these data busses are connected to individual transceivers 34 as shown in FIG. 3B.

Figure 4A:
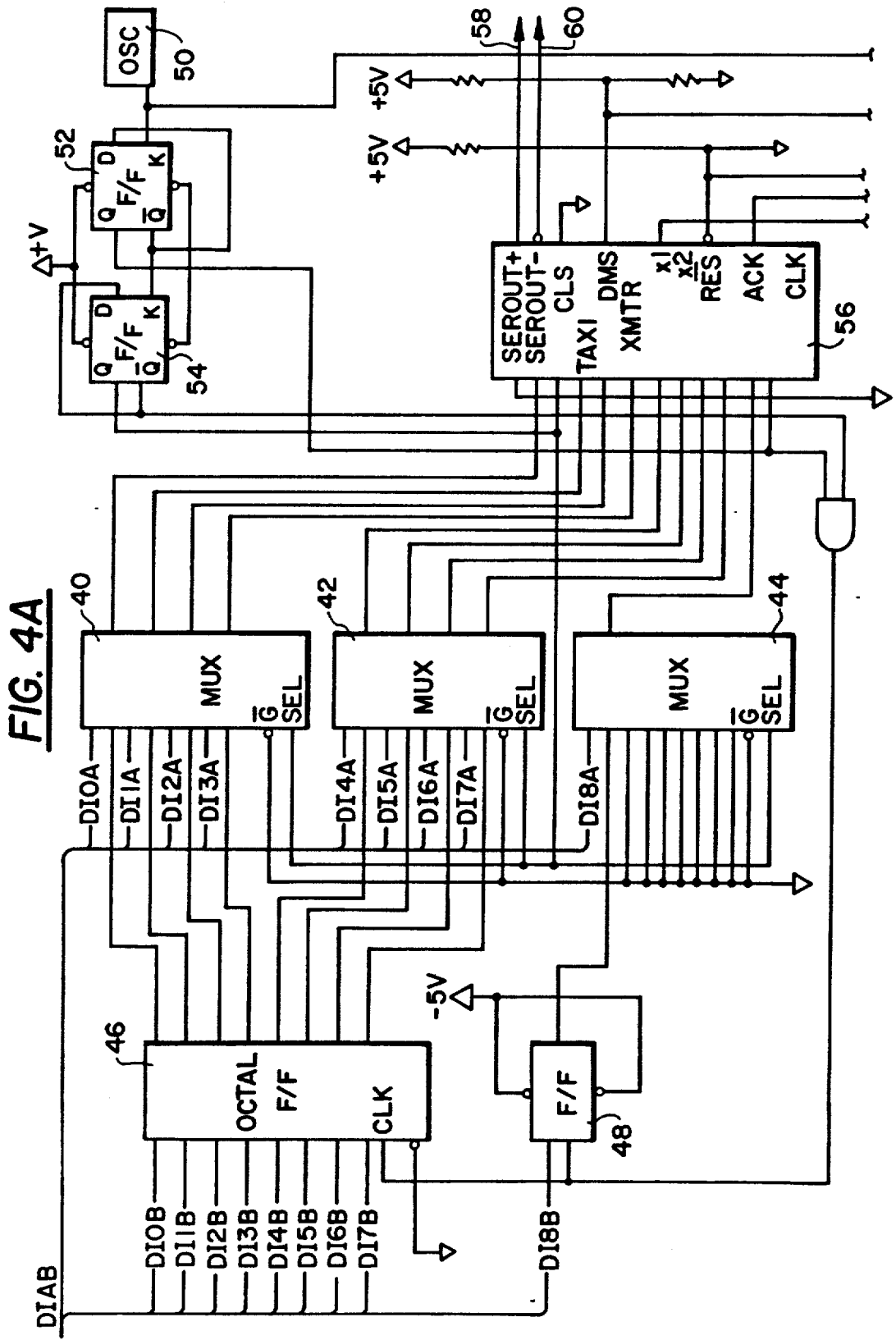
FIGS. 4A and 4B are schematic diagrams of the parallel to serial data converting and transmitting means employed in the computer network extender of the present invention.

As shown in FIG. 4A, each interface, such as interface 26, includes means for converting the parallel data from the connectors 32 and 32' into serial data format. The parallel to serial data conversion means comprises three multiplexers 40, 42 and 44. Each of the multiplexers 40, 42 and 44 is a quad, dual input device which receives four input signals from either of two groups of signals under the control of a control signal labeled SEL. As shown in FIG. 4A, the first group of inputs to the multiplexer 40 comprise signals labeled DI0A, DI1A, DI2A and DI3A. Similarly, signals labeled DI4A, DI5A, DI6A and DI7A are input in a first group to the multiplexer 42. Signal DI8A is input to the multiplexer 44. Each of these signals is contained on the data bus labeled DIAB. The data signals labeled DI0B-DI7B are input to an octal flip-flop 46 whose eight bit output is split into two groups respectively input to the multiplexers 40 and 42. The data signal DI8B is connected to a flip-flop 48. The output of the flip-flop 48 is connected as an input to the multiplexer 44. In this manner, an 18 bit word transferred in parallel from the SCSI controller 12 to the interface 26 passes through the connectors 32 or 32' and the transceivers 34 to the data bus DIAB. The multiplexers 40, 42 and 44 and the flip-flops 46 and 48 decode this data into two bytes of parallel data comprising a first 10 bit control signal byte followed by an 8 bit SCSI data byte.

The clock signals to the flip-flops 46 and 48, as well as the select signal SEL to the multiplexers 40, 42 and 44 are generated by an oscillator 50 whose output is connected to a pair of serially connected flip-flops 52 and 54. The oscillator 50 and the flip-flops 52 and 54 provide proper timing signals so as to cascade and decode the data signals into the two byte words described above.

Figure 4B:
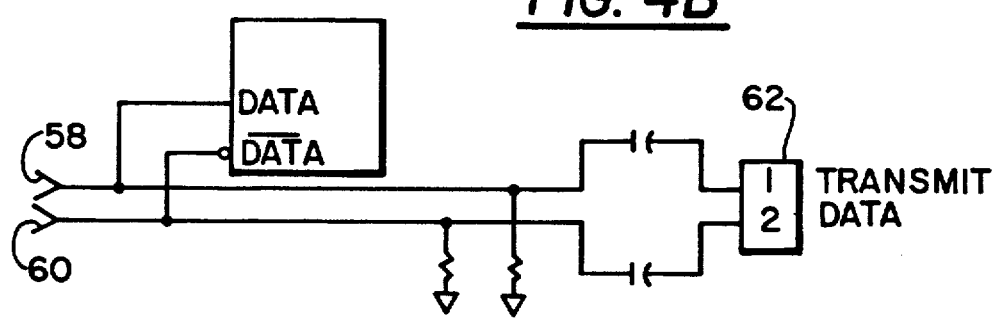

The output from the multiplexers 40, 42 and 44 is input in parallel to a taxi transmitter circuit 56. The taxi transmitter circuit is a parallel to serial data conversion device, such as one sold by Advanced Micro Devices as Model No. AM7968-125. The taxi transmitter circuit 58 converts the input parallel data to serial output data on positive and negative output lines 58 and 60, respectively. As shown in FIG. 4B, the outputs 58 and 60 are connected to a terminal 62 which is connected to one end of the serial communication means 30.

Figure 5B:
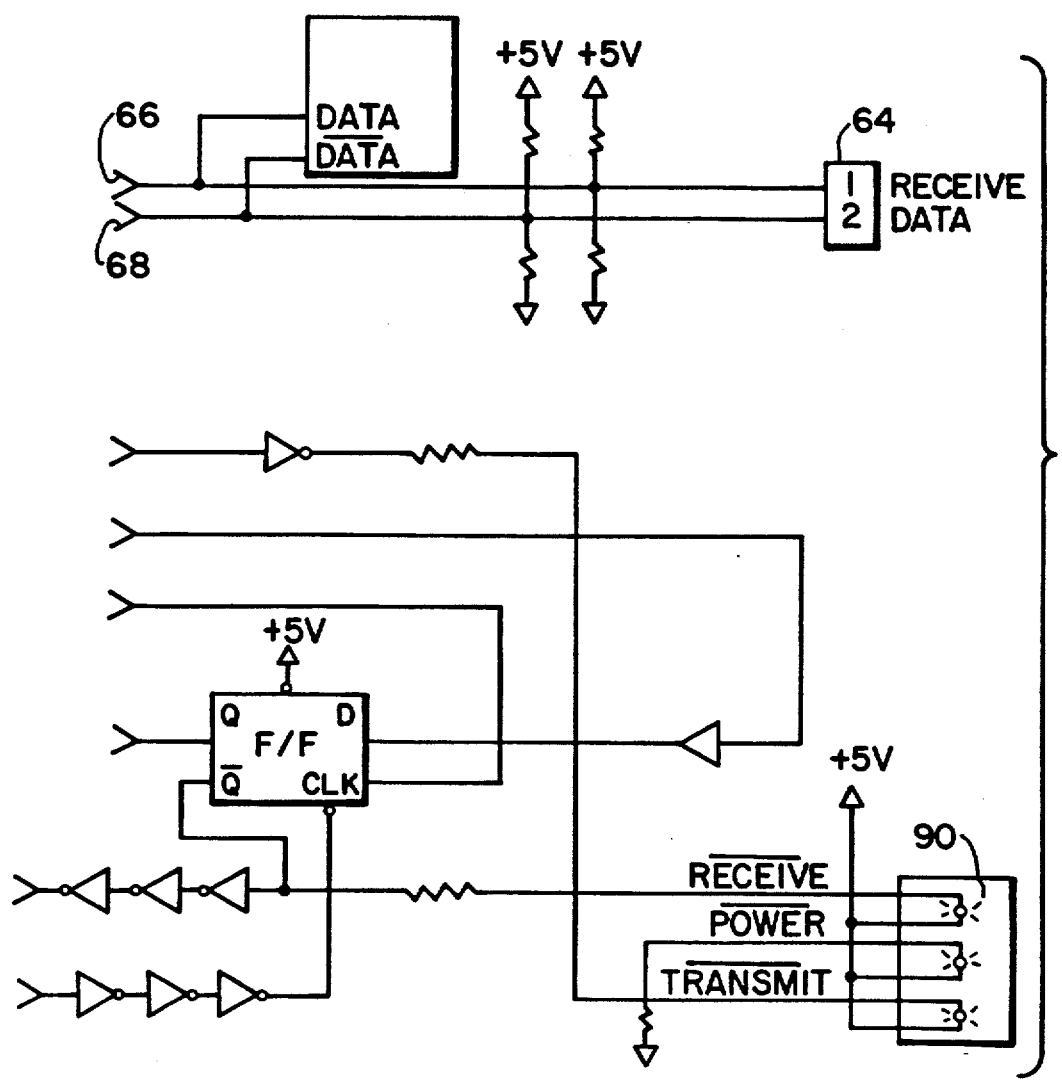
FIGS. 5A and 5B are schematic diagrams of the serial to parallel data converting and transmitting means employed in the computer network extender of the present invention.
Figure 5A:
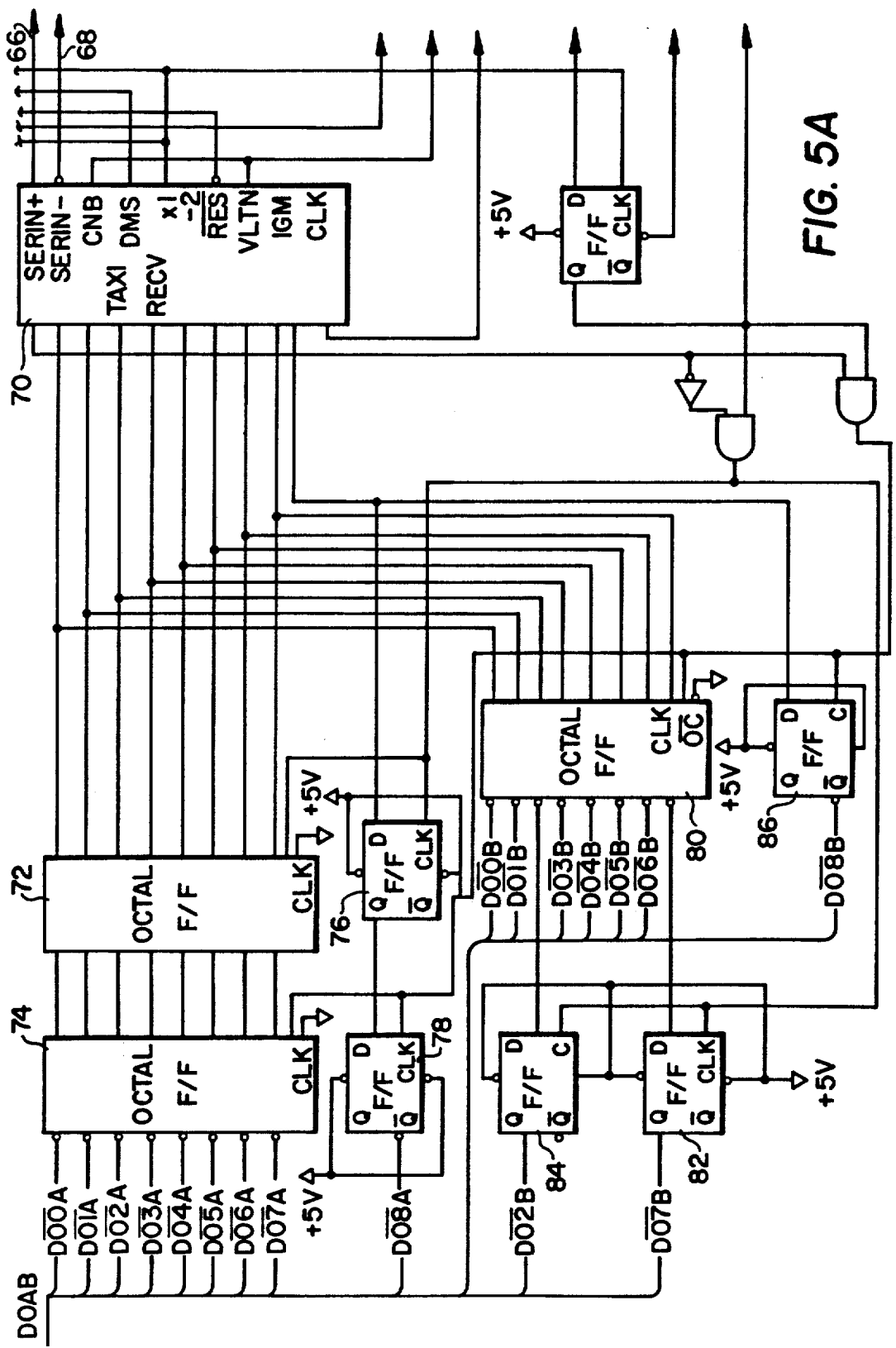

A similar circuit, shown in FIGS. 5A and 5B, is provided in the interface 26 for receiving serial data from the opposite interface 28 and converting such serial data to parallel data format for data transfer to the SCSI controller 12.

The serial communication means 30 conductors are connected to a receive data terminal 64, shown in FIG. 5B. A pair of positive and negative serial conductors 66 and 68, respectively, are connected between the terminal 64 and a taxi receive circuit 70, FIG. 5A. The taxi receive circuit 70 is a serial to parallel data conversion circuit sold by Advanced Micro Devices as Model No. AM7969-125. This taxi receive circuit 70 converts the serial input on lines 66 and 68 to nine bit parallel data output bytes. This output is divided into two successive bytes with the first byte passing through octal flip-flops 72 and 74 to the data bus DOAB as data signals DO0A-DO7A. The data signal DO8A is output from a pair of flip-flops 76 and 78 connected to the taxi receiver circuit 70. The second byte of data from the taxi receive circuit 70 is input through an octal flip-flop 80 to generate data signals DO0B-DO6B. One output from the octal flip-flop 80 passes through flip-flop 82 to generate the signal labeled DO7B. Another output from the octal flip-flop 80 passes through a flip-flop 84 to generate the signal DO2B. A flip-flop 86 is directed connected to the taxi receive circuit 70 and generates data signal DO8B.

These signals are grouped and passed along the data bus DOAB to the transceivers 34, shown in FIG. 3B.

The output signals from the taxi transmit circuit 56 and the taxi receive circuit 70 are also connected to illumination means 90, shown in FIG. 5B, for indicating the receive, power on and transmit modes of operation of the interface 26.

As noted above, the serial data communication means 30 connected between the interfaces 26 and 28 connects the transmit terminal 62 in the first interface 26 to the receive data terminal 64 in the second interface 28. A second serial data communication means 30 connects transmit data terminal 62 in the second interface 28 with the receive data terminal 64 in the first interface 26. The signal data communication means 30 may comprise any two-wire electrical conductor, such as a twisted pair of twin fibers or twin coaxial cables. Alternately, fiber optic conductors may be employed along with appropriate transceiver drivers.

In operation, as shown in FIG. 2, output signals from the SCSI controller 12 are output in parallel to the first interface 26. These signals are converted by the parallel to serial converting means shown in FIGS. 3A and 3B to serial format and transmitted over serial data communication cables 30 to the second interface 28. The second interface 28 reconverts the serial data to parallel format and transfers such data in parallel to the memory controller 16.

A reverse path from the memory controller 16 to the SCSI controller is also provided with the data being likewise converted from parallel to serial form and transmitted over the serial data communication cable 30 to the first interface 26 where it is again reconverted from serial to data format and transferred to the SCSI controller 12. This permits high speed serial data transfer between the first and second interfaces 26 and 28 over a considerable distance, such as up to 1.8 miles. This allows the SCSI controller 12 to be located at such a considerable distance from the memory controller 16 thereby providing increased flexibility and application of the computer network employing the computer network extender of the present invention. The computer network extender is of simple construction and requires no modification to conventional SCSI controllers, memory controllers and other memory devices.

What is claimed is:

1. A data communication network range expander formed of a first central processing unit connected to at least one second central processing unit and communicating between the first and second central processing units using a parallel small computer system interface ("SCSI") protocol, comprising:

a first unit connected in data communication with the first central processing unit, receiving SCSI protocol information, which includes parallel data, from said first central processing unit;

a second SCSI unit connected in data communication with the second central processing unit, receiving SCSI protocol information, which includes parallel data, from said second central processing unit;

each of the first and second SCSI units comprising:

means for separating said SCSI protocol information into two portions, a first portion which includes control information for said SCSI information and a second portion which includes data information for SCSI information;

a multiplexer, receiving said first portion on a first set of inputs thereof and receiving said second portion on a second set of inputs thereof, and producing an output corresponding to one of said set of inputs based on a control signal applied thereto;

controlling means for providing said control signal to control said multiplexing means to first output one of said sets of inputs in parallel at a first time period and next output the other of said set of inputs in parallel at a next time period;

parallel to serial means, connected to receive outputs from said multiplexer, for converting each parallel set of SCSI information from said multiplexer to a serial data format indicative of the parallel data;

serial to parallel means for converting data in said serial data format to SCSI format information which includes parallel data, and connecting said SCSI information to its associated central processing unit, said serial to parallel means comprising a first latch structure for receiving a first parallel word, and holding said first parallel word; and a second latch structure for receiving a second parallel word and holding said second parallel word;

means, responsive to the parallel to serial converting means, for transmitting said information in said serial format; and means, associated with the serial to parallel converting means, for receiving said serial data and connecting said serial data to said serial to parallel converting means; and serial data communication means for connecting the transmitting means of the first SCSI unit to the receiving means of the second SCSI unit and for connecting the receiving means of the first SCSI unit to the transmitting means of the second SCSI unit and performing serial data communication therebetween.

2. The network of claim 1 further including:

connector means for connecting the first and second interfaces to the first and second central processing units for parallel data communication therebetween; and 3. The network of claim 1 wherein the parallel data is 18 bits and the multiplexer means selects the parallel data in two successive parallel bytes.

4. The network of claim 1 wherein the serial data communication means comprises a pair of data communication conductors.

5. A small computer systems interface ("SCSI") range extender for communicating between a first central processing unit and a second central processing unit, comprising:

means for receiving SCSI information from said first central processing unit and for grouping said SCSI protocol information into a first group consisting of data information and a second group, different than said first group, and consisting of control information;

a multiplexer, having two groups of inputs which are multiplexed to form a single set of outputs, receiving said group of data information on one of said set of inputs and receiving said group of control information on the other of said set of inputs;

controlling means, for controlling said multiplexer to first output one of said set of inputs and subsequently to output the other of said set of inputs; and a parallel to serial converter, receiving said set of outputs of said multiplexer, for producing a first serial stream of information based on a set of outputs from said multiplexer at a first time and then producing a second serial stream of information based on a set of outputs from said multiplexer at a second time;

a serial data line, connected at one end to said parallel to serial converter and at the other end to said second central processing unit;

a serial to parallel converter, receiving information from said second central processing unit over said serial data line for converting said information into parallel information; and means for converting said parallel information into an SCSI signal indicative of information received from said second central processing unit, said converting means comprising a first latch structure for receiving a first parallel word from said serial to parallel converter, and holding said first parallel word; and a second latch structure for receiving a second parallel word from said serial to parallel converter and holding said second parallel word.

6. An expander as in claim 5 wherein one of said parallel words is a data word consisting of SCSI data and the other of said parallel words is a control word consisting of SCSI control information.

7. An expander as in claim 6 wherein a first word received is said control word and a second word received is a data word.

* * * * *